United States Patent [19]

Walker

[11] 4,345,209

[45] Aug. 17, 1982

[54] MISSING PULSE DETECTOR

[75] Inventor: Michael J. Walker, Warley, England

[73] Assignee: Lucas Industries Limited, Birmingham, England

[21] Appl. No.: 152,127

[22] Filed: May 21, 1980

[30] Foreign Application Priority Data

May 25, 1979 [GB] United Kingdom ............... 7918385

[51] Int. Cl.³ .......................... H03K 5/19; H03K 5/26
[52] U.S. Cl. .................................... 328/120; 328/75; 328/147; 328/149
[58] Field of Search ................ 328/120, 165, 167, 75, 328/146, 147, 149

[56] References Cited

U.S. PATENT DOCUMENTS

| 3,213,375 | 10/1965 | St. John | 328/120 |
| 4,117,348 | 9/1978 | Newman | 328/120 |
| 4,127,824 | 11/1978 | Bennett | 328/167 |

Primary Examiner—John S. Heyman
Attorney, Agent, or Firm—Trexler, Bushnell & Wolters, Ltd.

[57] ABSTRACT

A missing pulse detector includes a plurality of signal accumulation capacitors which are discharged periodically and then charged via resistor during the periods between pulses in the input pulse train at an input terminal. The voltage signals on the capacitors are compared by comparators the resistors being of values such that the comparator outputs are high (at the comparison time) unless a pulse is missed.

5 Claims, 2 Drawing Figures

MISSING PULSE DETECTOR

This invention relates to a missing pulse detector, i.e. an electronic circuit capable of producing an output signal when a pulse is missing from a regular pulse train supplied to the circuit.

Various missing pulse detectors have previously been proposed, but these are of limited applicability since they are either extremely complicated and expensive or operate only over a limited frequency range.

A missing pulse detector in accordance with the invention comprises a plurality of signal accumulating devices, reset means for each signal accumulating device, signal admission means for each signal accumulating device, sequence control means controlled by the input pulse train and controlling each of said reset means and each of said signal admission means, in such a manner that each signal accumulating device is reset and then accumulates a signal for a time dependent on the duration of the intervals between successive pulses of the input pulse train, and comparison means for comparing the signals accumulated in different ones of said signal accumulation devices during different inter-pulse intervals.

The signal accumulation devices are preferably capacitors said reset means being a switchable discharge path for each capacitor and said signal admission means being a switchable charging path for each capacitor.

Alternatively the signal accumulating devices could be digital counters accumulating clock pulses and the comparison means would then be digital type comparators.

Preferably there are first, second, third and fourth capacitors, the charging paths of the first and fourth capacitors being of lower resistance than the other charging paths, the sequence control means causing the charging paths of the first and second capacitors to be functional simultaneously and causing the charging paths of the third and fourth capacitors to be functional simultaneously, and the comparison means comparing the signal on the first capacitor with that on the third capacitor, and comparing the signal on the second capacitor with that on the fourth capacitor.

An example of the invention is shown in the accompanying drawings, in which.

Figure 1:
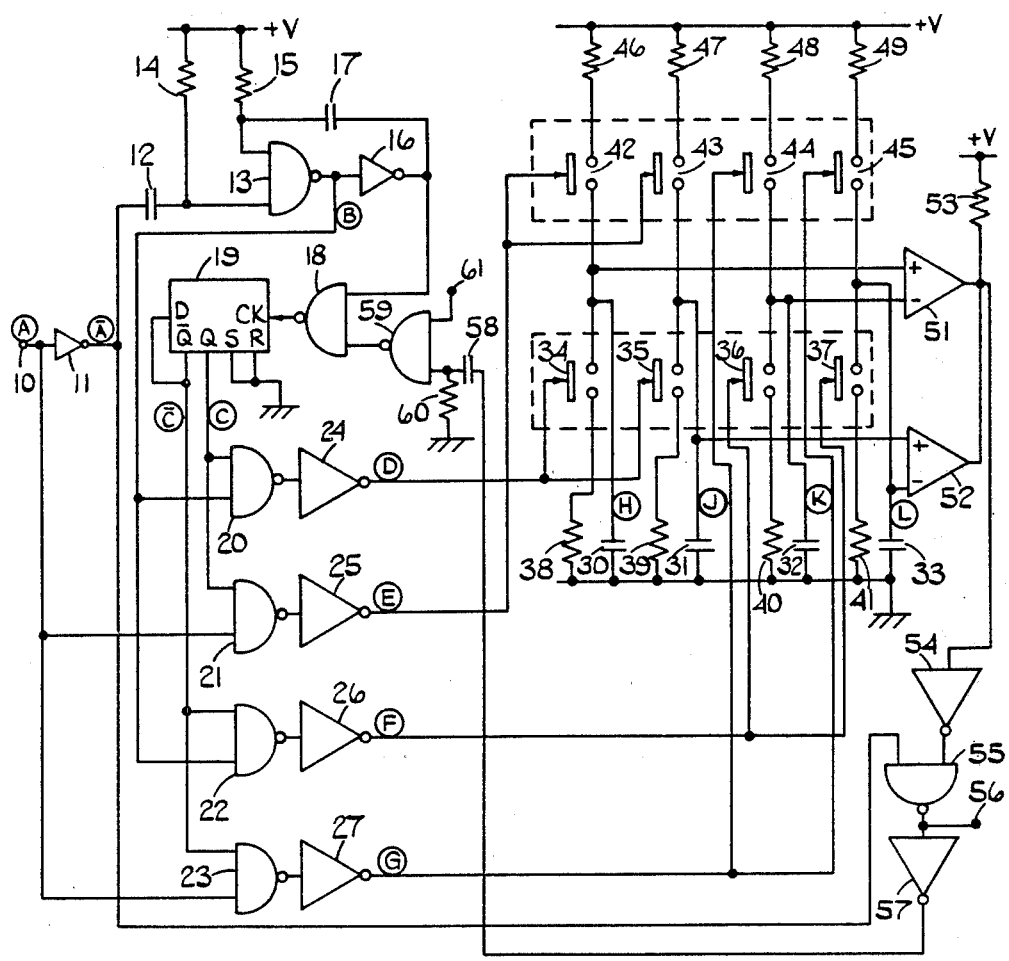
FIG. 1 is a circuit diagram of the detector.

The detector shown in FIG. 1 has an input terminal 10 to which the pulse train under examination is applied. This terminal is connected to the input of an inverter 11, the output of which is connected via a capacitor 12 to one input of a NAND gate 13, both inputs of which are connected by pull-up resistors 14, 15 to a +ve supply. The output of the gate 13 is connected to the input of an inverter 16 the output of which is connected by a capacitor 17 to the other input of gate 13. Components 12 to 17 inclusive constitute a monostable circuit in which the negative-going edges of the output of inverter 11 cause the output of gate 13 to go high for a set time for example about 200 μS.

The output of gate 13 is connected to one input of a NAND gate 18 the output of which is connected to the CLOCK input of a CMOS integrated circuit D-type flip-flop circuit 19, the SET and RESET terminals of which are both grounded, and the D input terminal of which is connected to the $\overline{Q}$ output. Four NAND gates 20, 21, 22 and 23 are provided and each of gates 20 and 21 has one input connected to the $\overline{Q}$ output of flip-flop circuit 19, whereas each of gates 22, 23 has one input connected to the Q output of circuit 19. The other input of each of gates 20, 22 is connected to the output of gate 13 and the other input of each of gates 21 and 23 is connected to terminal 10. Each gate 20, 21, 22 23 has an associated inverters 24, 25, 26 or 27 at its output.

Figure 2:
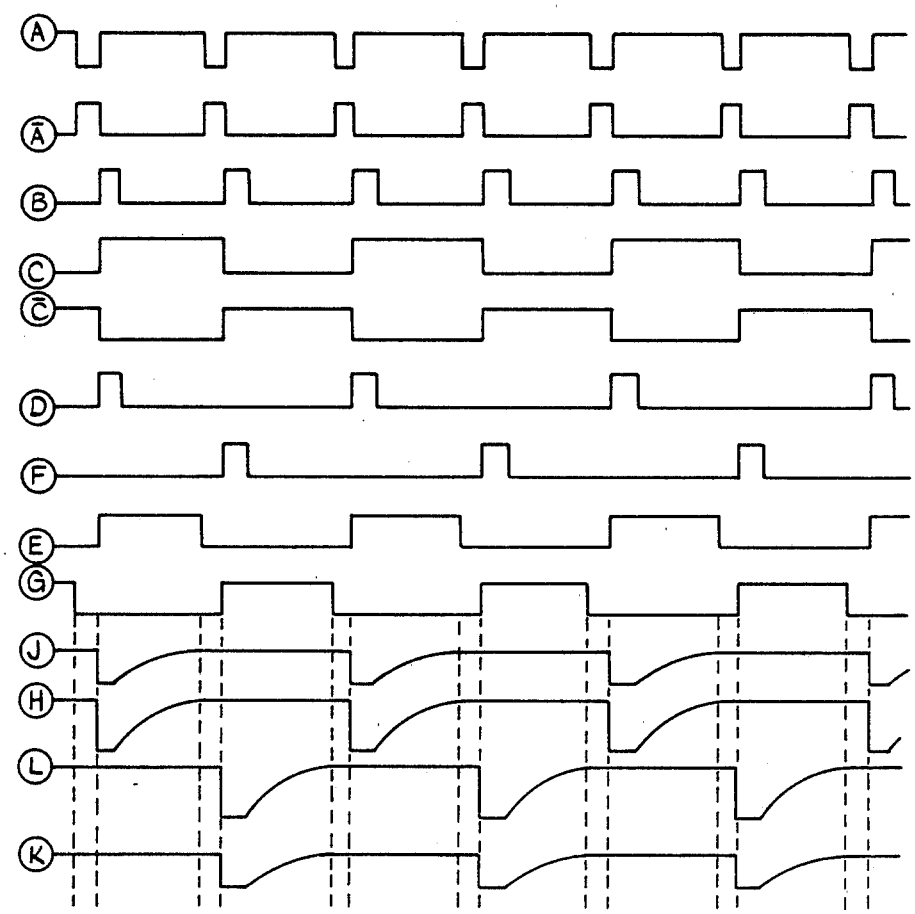
FIG. 2 is a graphical representation of the wave forms at various points in the detector.

The circuit elements thus far described form a sequence control circuit which is controlled by the input pulse train as shown in the upper nine traces in FIG. 2.

The detector also includes first, second, third and fourth capacitors 30, 31, 32 and 33, one side of each of which is earthed. The other side of each capacitor 30, 31 32, 33 is connected to earth by an associated one of four discharge switches 34, 35, 36 and 37 and an associated one of four discharge resistors 38, 39, 40 and 41 in series with the respective discharge switches. The other side of each capacitor 30, 31, 32 and 33 is also connected to a +ve supply by an associated one of four charge switches 42, 43 44 and 45 and an associated one of four charge resistors 46, 47, 48 and 49 in series with respective ones of the charge switches.

The discharge switches 34 to 37 and the charge switches 42 to 45 are all CMOS integrated circuit switches (type 4066), each switch having a control terminal connected to an appropriate one of the inverters 24 to 27. As shown the control terminals of discharge switches 34 and 35 are connected to the output of inverter 24, the control terminals of switches 36 and 37 are connected to the output of inverter 26, the control terminals of switches 42 and 43 are connected to the output of inverter 25 and the control terminals of switches 44 and 45 are connected to the output of inverter 27.

As is shown in FIG. 2 when the output of inverter 24 is high (even though the output of inverter 25 is high at the same time) capacitors 30 and 31 are discharged rapidly, resistors 38 and 39 being of relatively low ohmic value and similarly when the output of inverter 26 is high capacitors 32 and 33 are discharged. When the output of inverter 24 is low, but that of inverter 25 is high capacitors 30 and 31 are charged via the resistors 46 and 47 respectively. Resistor 46 is of lower ohmic value than resistor 47 so that capacitor 30 charges more rapidly than capacitor 31 and thus achieves a higher voltage during the time for which the output of inverter 25 is high. Similarly, when the output of inverter 27 alone is high, capacitors 32 and 33 charge, the capacitor 33 charging at the higher rate.

Comparison means is provided for comparing the voltages on the various capacitors 30 to 33. Such comparison means comprises two integrated circuit comparators 51, 52 which are of the open collector output transistor type, the two outputs being connected by a common load resistor 53 to the +ve supply. The comparator 51 has its inverting input connected to said other side of the capacitor 32 and its non-inverting input connected to said other side of the capacitor 30. Similarly comparator 52 has its inverting input connected to said other side of capacitor 31 and its non-inverting input connected to said other side of capacitor 33. Thus the output of comparator 51 goes low whenever the voltage on capacitor 32 is greater than that on capacitor 30 and the output of comparator 52 goes low whenever the voltage on capacitor 31 is higher than that on capacitor 33. When the output of either comparator 51, 52 is low current flows in resistor 53 and provides a low input into the next stage of the circuit which is an inverter 54. The output of inverter 54 is connected to one input of a NAND gate 55, the other input of which is connected to the output of inverter 11. The output of gate 55 is connected to an output terminal 56 of the circuit and is also connected to the input of an inverter 57 the output of which is connected by a capacitor 58 to one input of a NAND gate 59, this same input being connected by a resistor 60 to earth. The gate 59 has another input connected to a terminal 61 at which there is normally a high input, but which can for reasons not directly connected with the present invention, sometimes receive a low input. The output of gate 59 is connected to an input of gate 18.

Ignoring for the moment the effect of inverter 57 and gate 59, when the input pulses at terminal 10 are arriving at constant frequency the situation illustrated by the waveforms of FIG. 2 obtains. Thus alternate input pulses trigger the charging of capacitors 30 and 31, and the remaining alternate input pulses trigger the charging of capacitors 32 and 33. Although the comparators 51 and 52 are operating continuously their outputs are only communicated to the output terminal when the output of inverter 11 is high, thereby enabling gate 55. In the steady, regular pulse condition illustrated all the capacitors are charged for identical periods so that capacitors 30 and 33 have a higher voltage than capacitors 31 and 32 at the instants when the gate 55 is enabled and thus neither comparator 51 nor 52 is providing a low output at these instants.

In the event that one input pulse is missing, for example, the third negative-going pulse in the upper trace of FIG. 2, the flip-flop circuit 19 will not be triggered and the two capacitors 30 and 31 charging at this time will continue charging until the next input pulse arrives. Thus these capacitors will have been charged for more than twice the normal time. Thus when the next pulse does arrive the voltage on capacitor 31 will exceed that on capacitor 33, the output of comparator 51 will go low and the output of gate 55 will thus also go low indicating that a pulse has been missed.

It is when a missing pulse is detected that the inverter 57 and the gate 59 come into use. As a result of the output of gate 55 going low, the output of gate 59 goes low for a time determined by the values of capacitor 58 and resistor 60, so that an additional pulse is provided at the clock input of flip-flop circuit 19. Thus the capacitors (in the example described above 30 and 31) which were excessively charged and immediately discharged, whilst capacitors 32 and 33 continue to hold their existing charge. When the next occurring input pulse arrives, therefore, another valid comparison can be made.

The circuit described above is intended to be used in an internal combustion engine ignition system test apparatus, and the pulses at its input are generated in such apparatus whenever the system performs a successful spark producing operation. Thus the missing pulse detector is, in this application, actually detecting missing sparks. In such apparatus the circuit described enables missing sparks to be detected over a very wide range of engine running speeds limited (at the upper end), by the fixed lengths of the input pulses (generated in another part of the apparatus) and the fixed lengths of the output pulses from the gate 13. If, however, these pulses are kept short, e.g. 200 $\mu$S an adequate speed range is available.

The detector circuit described can also be employed in many other applications provided that rate of change of frequency of the input pulses is not so high that the ratio of the intervals between one pulse and the preceding pulse and that pulse and the following pulse is so great that a "missing" pulse is detected when none has been missed.

I claim:

1. A missing pulse detector for producing an output signal whenever a pulse is missing from a regular, but variable frequency, pulse train supplied to the detector by accumulating a signal in a signal accumulating device during the interval between successively received pulses and analyzing the signal accumulated, said detector comprising a plurality of signal accumulating devices, reset means for each signal accumulating device, signal admission means for each signal accumulating device such that some of the signal accumulating devices have a higher rate of signal accumulation than the remainder, sequence control means controlled by the input pulse train and connected to control each of said reset means and each of said signal admission devices in such a manner that each signal accumulating device is reset by alternate pulses and then accumulates a signal for a time dependent on the duration of the intervals between successive pulses of the pulse train, and comparison means connected to compare the signal accumulated by one of the signal accumulating devices during one interval between successive pulses with the signal accumulated at a different rate by another one of the signal accumulating devices in a different interval between successive pulses and to produce said output signal if the signal accumulated by said one device differs from that accumulated by said other device in the sense opposite that which would result from the different rate of signal accumulation in equal intervals.

2. A detector as claimed in claim 1 in which the signal accumulation devices are capacitors, said reset means being a switchable discharge path for each capacitor and said signal admission means being a switchable charging path for each capacitor.

3. A detector as claimed in claim 2 in which there are first, second, third and fourth capacitors, the charging paths of the first and fourth capacitors being of lower resistance than the other charging paths, the sequence control means causing the charging paths of the first and second capacitors to be functional simultaneously and causing the charging paths of the third and fourth capacitors to be functional simultaneously, and the comparison means comparing the signal on the first capacitor with that on the third capacitor, and comparing the signal on the second capacitor with that on the fourth capacitor.

4. A detector as claimed in claim 3 in which said comparison means comprises first and second voltage comparators.

5. A detector as claimed in claim 4 in which said sequence control means comprises a monostable circuit connected to be driven by the input pulse train, a flip-flop circuit connected to be clocked by the monostable circuit an array of gates having inputs connected to different combinations of the input pulse train, the bistable circuit outputs and the monostable circuit output, and a plurality of switches in said charging and discharge paths of the capacitors, said switches being controlled by the gates in said array of gates.

* * * * *